United States Patent [19]

Borrelo et al.

[11] 3,897,275

[45] July 29, 1975

[54] PROCESS FOR FABRICATING SCHOTTKY BARRIER PHOTOTRANSISTOR

[75] Inventors: Sebastian R. Borrelo, Richardson; Jimmy D. Sawyer, Garland, both of Tex.

[73] Assignee: Texas Instruments Incorporated, Dallas, Tex.

[22] Filed: May 11, 1973

[21] Appl. No.: 359,586

Related U.S. Application Data

[60] Division of Ser. No. 833,241, May 22, 1969, abandoned, and a continuation of Ser. No. 848,126, April 25, 1969, abandoned, said Ser. No. 833,241, is a continuation of Ser. No. 626,651, Jan. 25, 1967, abandoned.

[52] U.S. Cl. .................... 148/1.5; 148/187; 357/15

[51] Int. Cl. .............................................. H01l 7/36

[58] Field of Search ............ 148/1.5, 187; 317/234, 317/235

[56] References Cited

UNITED STATES PATENTS

| | | | |
|---|---|---|---|
| 3,018,539 | 1/1962 | Taylor et al. | 148/187 X |
| 3,309,553 | 3/1967 | Kroemer | 317/235 X |
| 3,436,549 | 4/1969 | Pruett | 317/235 X |

*Primary Examiner*—Dewayne Rutledge
*Assistant Examiner*—J. M. Davis
*Attorney, Agent, or Firm*—Harold Levine; James T. Comfort; William F. Hiller

[57] ABSTRACT

Disclosed is a phototransistor comprised of an indium arsenide n-type semiconductor substrate, a thin, relatively lightly doped p-type cadmium diffused region in the substrate forming a photosensitive diode junction, and a metal film in rectifying contact with the p-type diffused region to form a Schottky barrier.

The method for fabricating the transistor comprises producing the shallow cadmium diffusion, etching the surface of the diffused region to a predetermined depth to reduce the doping level and the surface oxide level, and depositing the metal film on the etched surface of the diffused region.

16 Claims, 15 Drawing Figures

INVENTOR
SEBASTIAN R. BORRELLO
JIMMY D. SAWYER

E. Mickey Hubbard
ATTORNEY

INVENTOR
SEBASTIAN R. BORRELLO
JIMMY D. SAWYER

E. Mickey Hubbard
ATTORNEY

PROCESS FOR FABRICATING SCHOTTKY BARRIER PHOTOTRANSISTOR

This is a continuation of Ser. No. 848,126, Apr. 25, 1969, abandoned; a division of Ser. No. 833,241, May 22, 1969, abandoned; said 833,241 a continuation of Ser. No. 626,651, Jan. 25, 1967, now abandoned.

BACKGROUND OF THE INVENTION

This invention relates generally to semiconductor devices, and more particularly to an improved phototransistor and process for fabricating same.

Various types of semiconductor photodiodes have been fabricated which produce current substantially in proportion to the quantum of light striking the diode junction. This type of structure is typically used for infrared detection, but such use generally requires the current to be greatly amplified. Considerable effort has been directed toward developing an integrated circuit capable of both detecting and amplifying the resulting current signal. Phototransistor structures proposed for this purpose are commonly formed by a pair of diffused junctions or by a diffused junction and an alloyed junction. While these devices generally increase the current levels produced for a given photon level, and the detectivity is not particularly high because of the high noise levels associated with the devices.

SUMMARY OF INVENTION CLAIMED

The phototransistor claimed below comprises two junctions: (1) a junction formed between a p-type diffused region and an n-type substrate, and (2) a Schottky barrier junction formed between a metal film and the p-type region. In more detailed claims of the invention, the semiconductor, the impurities of the diffused region, and the metal are specified.

A process is also claimed which comprises diffusing p-type impurities into a selected region of an n-type substrate to a shallow depth, removing a portion of the surface of the diffused region by etching to expose a low impurity concentration surface having a low oxide level, and depositing a metal film on the surface of the p-type region to establish a rectifying contact.

The phototransistor provides both a detector function and an amplification function in a single device. The device is very simple to fabricate; has a high current gain, typically as much as forty times the gain previously obtainable; requires no contact to the base region; and contributes negligible noise to the amplified signal. The low impedance of the device, typically 1,000–2,000 ohms, makes incorporation into simple transistor circuitry ideal. Background-limited performance has been observed with the phototransistor cooled to only 200° K, a temperature obtainable with dry ice.

DESCRIPTION OF PREFERRED EMBODIMENTS

In the following specification, the process for fabricating the phototransistor is first described, then the operation of the phototransistor are described, and finally data illustrating the outstanding performance of phototransistors fabricated in accordance with the invention is shown.

Figure 1A:
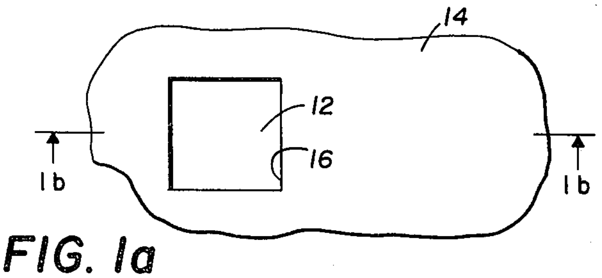
FIGS. 1*a*, 2*a*, 3*a*, and 4*a* are schematic plan views illustrating the process in accordance with the present invention, FIG. 4*a* illustrating the device in accordance with the present invention.
Figure 1B:
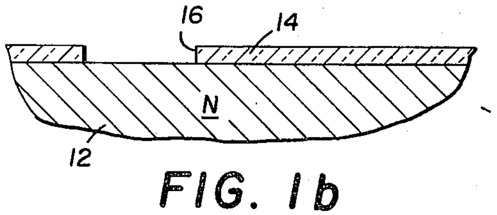
FIGS. 1*b*, 2*b*, 3*b*, and 4*b* are sectional views taken on lines 1*b*–1*b*, 2*b*—2*b*, 3*b*—3*b*, and 4*b*—4*b* of FIGS. 1*a*, 2*a*, 3*a*, and 4*a*, respectively.
Figure 2A:
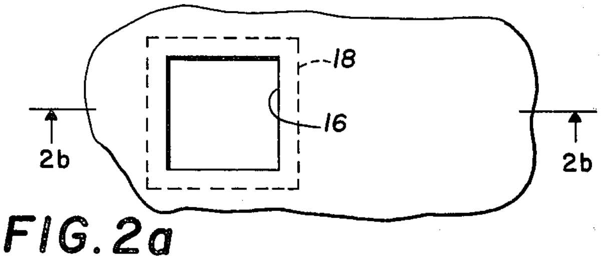
Figure 2B:
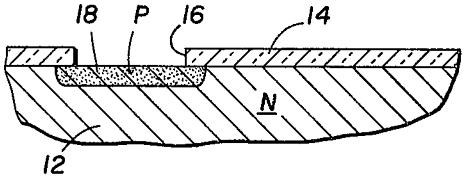
Figures 3A, 4A:
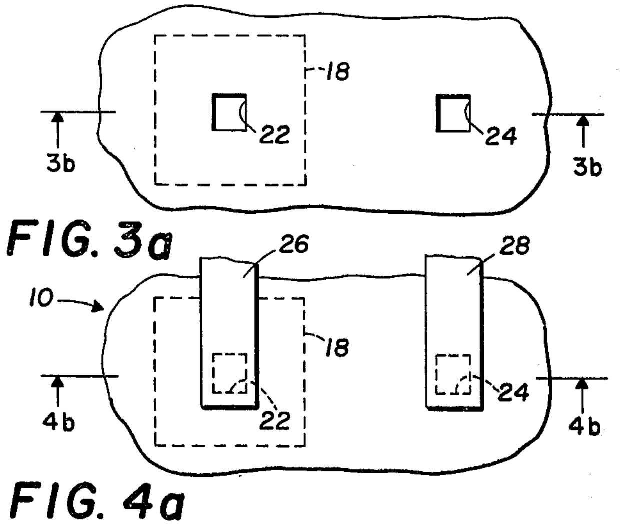
Figure 3B:
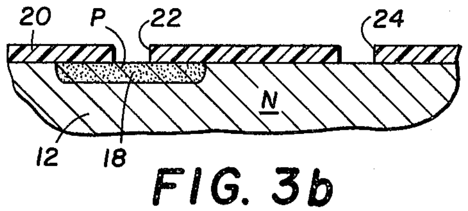
Figure 4B:
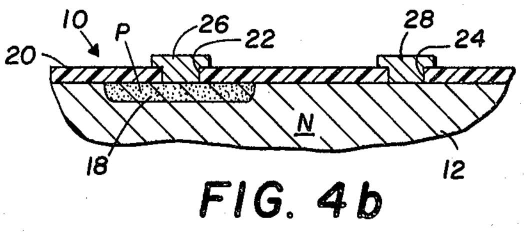

Referring now to the drawings, and in particular to FIGS. 1*a*–1*b* through 4*a*–4*b*, a phototransistor constructed in accordance with the present invention is indicated generally by the reference numeral 10 in FIGS. 4*a* and 4*b*. This phototransistor 10 is fabricated by starting with an n-type substrate 12 which may be indium arsenide (InAs), indium antimonide (InSb), and gallium antimonide (GaSb). All of the other III-V semiconductor compounds are also potential candidates for use as the semiconductor substrate although at the present time these are not commercially attractive.

The preferred semiconductor used for the substrate 12 is n-type indium arsenide having an impurity concentration of from about $2 \times 10^{16}$ to about $4 \times 10^{16}$ atoms/cc and a typical resistivity on the order of 0.1 ohm-centimeter. A diffusion mask 14 having a window 16 is formed on the surface of the substrate 12 using conventional techniques (see FIGS. 1*a*–1*b* and 2*a*–2*b*). For example, the mask 14 may be a silicon dioxide layer deposited by the conventional process involving the decomposition of tetraethyl orthosilicate (TEOS). Then, the silicon dioxide layer is coated with a suitable photoresist, such as Kodak Thin Film Resist (KTFR), a window, typically 8 × 8 mils, developed in the KTFR, and the opening 16 etched in the silicon dioxide using either hydrofluoric acid or commercially available Bell Telephone silicon dioxide etching solution.

Next, a p-type impurity is diffused through the opening 16 into the substrate using a conventional two zone diffusion furnace to form the diffusion region 18. The impurity is preferably cadmium, although other suitable impurities, such as, for example, zinc and magnesium, may be used if desired. This diffusion is typically accomplished by putting the substrate 12 within one end of an evacuated quartz capsule, and the impurity source, typically a solid comprised of about 20% cadmium and 80 percent indium, within the other end of the capsule. The capsule is then placed in a two zone diffusion furnace to heat the impurity source material to about 600° C and the semiconductor substrate 12 to about 650° C. As a result of this diffusion process, the diffused region 18 typically has a surface concentration of about $8 \times 10^{16}$ atoms/cc, an error function profile, and a junction depth of about 20 microns.

Next, the silicon dioxide mask 14 is removed from the entire surface of the slice using hydrofluoric acid. In order to achieve the low impurity concentration and low oxide level necessary for a Schottky barrier rectifying junction, the entire slice is then subjected to etching solutions and the surface removed to a depth of about 10 microns. The first etching solution may be a semiconductor grade white etch, which is a solution containing three parts nitric acid ($HNO_3$) to one part hydrofluoric acid (HF), and the following an etch solution of 5 percent bromine in methanol. The white etch is typically used to remove the first micron or so of the substrate, and the bromine solution is used to remove the final portion.

Next, the entire surface of the substrate 12 is coated with a layer of suitable insulating material 20, preferably a photo resist such as KTFR (see FIGS. 3*a*–3*b* and 4*a*–4*b*). The photoresist is then patterned merely by exposing and developing the resist to leave a contact opening 22 over the diffused region 18 and a contact opening 24 over a portion of the substrate 12. When KTFR is used for the insulating layer 20, it may be fixed by heating or other technique to produce a hard polymer insulating layer.

Next, the insulating layer 20 is covered with a thin film of vacuum deposited metal, and the metal patterned to produce contacts 26 and 28, which extend through the openings 22 and 24 to respectively contact the diffused region 18 and the n-type substrate 12. The metal is preferably aluminum, although the choice of metals is not highly critical so long as it does not tend to alloy with or diffuse into the semiconductor. In general, gold and the transition metals can be used for this purpose. The metal film is typically about 5,000 angstroms thick. As a result of the low concentration of the p-type region 18, a Schottky barrier rectifying junction results between the metal contact 26 and the p-type region 18. However, an ohmic contact results between contact 28 and the n-type substrate 12. Thus, a metal, p-type, n-type phototransistor is formed by the contact 26, the p-type region 18, and the n-type substrate 12, with rectifying junctions, i.e., potential barriers, formed between metal contact 26 and the p-type diffused region 18, and between the p-type diffused region 18 and the n-type substrate 12. The insulating layer 20 and, to a large extent, the thin metal contact 26 are transparent to light energy, which is absorbed in the diffused region 18 produce excess carriers.

Figure 5:
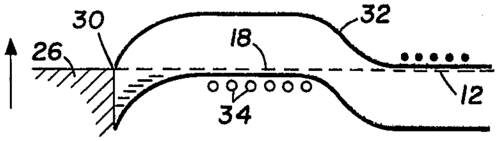
FIG. 5 is a schematic diagram of an energy band model of the phototransistor of FIGS. 4*a* and 4*b* with no bias.
Figure 6:
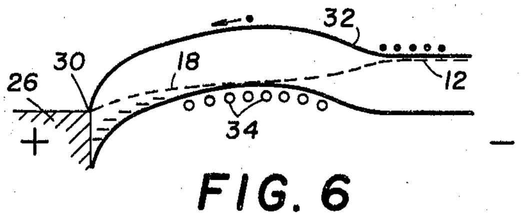
FIG. 6 is a schematic diagram of the energy band model of the phototransistor of FIG. 4a under a forward bias.
Figure 7:
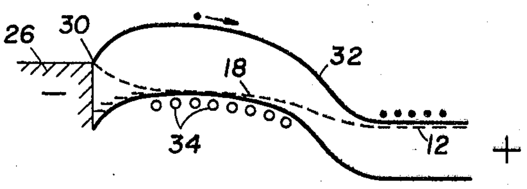
FIG. 7 is a schematic diagram of the energy band model of the transistor of FIG. 4*a* under a negative bias.

An energy band model of the phototransistor 10, under zero bias conditions, is illustrated in FIG. 5. The Schottky barrier rectifying junction between the metal contact 26 and the p-type region 18 is illustrated at 30, while the junction formed between the diffused region 18 and the substrate 12 is indicated by the region of the curved lines at the portion indicated by the numeral 32. The free holes 34, which appear in the p-type region 18 when photons are absorbed, cannot recombine in the metal contact region 26 or in the n-type substrate 12 because their motion is impeded by the Schottky barrier and the diffused barrier. Recombination occurs with electrons which move through the p-type region 18 from the metal 26 to the substrate 12. When the electron transit time through the p-type region 18 is much less than the lifetime of the excess holes 34 (the majority carriers), a current gain is achieved because the excess positive space charge causes a large electron flow in substantially the same manner as base current in a conventional transistor. However, it should be noted that no additional base current is provided in the transistor 10, merely a bias from emitter to collector. Thus, amplification results since the holes 34 in the p-type region 18 are immobilized by the barriers, and since the probability of recombination in the p-type region 18 is considerably less than the probability of electrons traversing this region. Thus, the gain should vary inversely with the thickness of the p-type region 18 and the majority carrier concentration in the p-type region 18. The model also suggests that gain will be achieved for both a positive and a negative bias when tunnelling is negligible, as illustrated in FIGS. 6 and 7.

Figure 8:
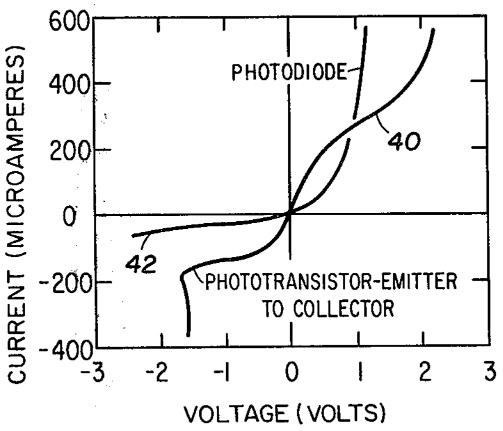
FIG. 8 is a current voltage plot comparing a conventional photodiode and a phototransistor in accordance with the present invention.

The current-voltage characteristics of a typical phototransistor constructed in accordance with the present invention is indicated by the curve 40 in FIG. 8, and is compared with the current-voltage curve 42 of a typical photodiode. In FIG. 8, the phototransistor is biased from emitter to collector, that is, from contact 26 to contact 28. The photodiode and phototransistor represented by the curves 42 and 40, respectively are assumed to have the same diffused junction area that is sensitive to photon energy. It should be noted from the relative slopes of the curves 40 and 42 that the phototransistor has an a.c. impedance near zero bias of about 2,000 ohms, more than an order of magnitude less than the impedance of the photodiode. The negative resistance region at reverse bias is characterized by oscillations having a composite magnitude of 90 percent of the applied d.c. level and the frequency of which increases with current. The same negative resistance characteristic is also present at strong forward bias voltages outside the scope of the graph of FIG. 8. Although these negative resistance characteristics may have particular applications, in a high gain phototransistor application, the bias regions of immediate interest lie about zero bias within the nearly linear portion of the current-voltage curve 40.

Figure 9:
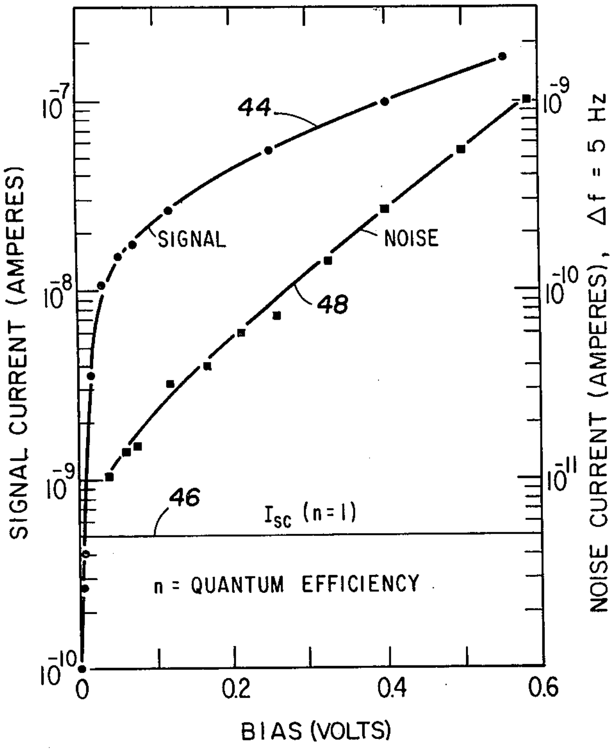
FIG. 9 is a plot of signal current and noise current with respect to bias voltage of a phototransistor in accordance with the present invention.

When exposed to modulated infrared radiation, the signal current is a function of the applied bias voltage below 50 millivolts. The function rises steadily as the bias is increased to about one volt, then gradually descends with a further increase in bias. In FIG. 9, the signal current in the bias region between 50 millivolts and 0.6 volts where the signal current rises, is represented by curve 44 and is compared with a calculated value of the photon signal current ($I_{SC}$), represented by line 46, for the same infrared flux density, assuming a quantum efficiency of unity. In this case, it will be noted that a signal current gain of more than 400 is achieved. The dependence of signal current on bias voltage is not yet understood, but may be associated with the relative potentials across the Schottky barrier and the diffused junction.

A striking feature of the phototransistor is that the device is nearly photon-noise-limited for low values of bias voltage. With increasing bias, however, the noise increases logarithmically as represented by curve 48, suggesting thermal current noise limitation at bias values above 100 millivolts. In one typical device, the unamplified noise curve was $2 \times 10^{-13}$ amperes (rms) when the device was biased for maximum signal-to-noise ratio. The calculated photon contribution was 1.2 $\times 10^{-13}$ amperes (rms), and the thermal current (saturation current term) contribution was $8 \times 10^{-14}$ amperes (rms).

Figure 10:
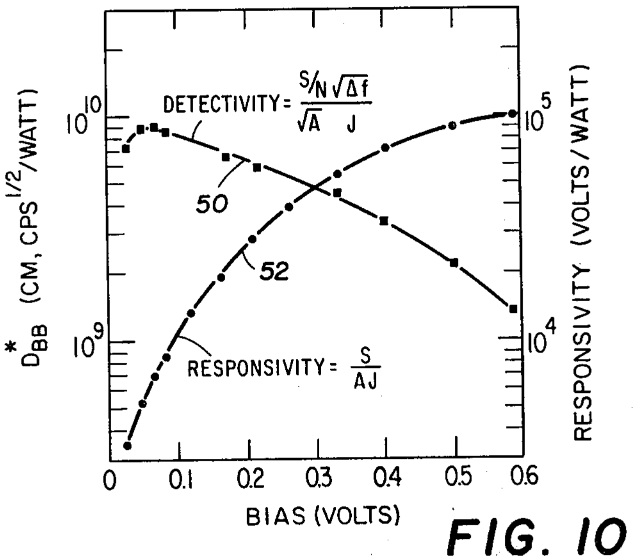
FIG. 10 is a plot of detectivity and responsivity with respect to bias voltage of a phototransistor in accordance with the present invention.

As a result of the signal and noise functions, the detectivity $>D^*_{BB}$, as represented by curve 50 in FIG. 10, has an optimum value of about $10^{10}$ with a bias of 100 millivolts. The responsivity, as represented by curve 52 in FIG. 10, increases according to the signal and reaches a value of about $10^4$ near optimum D* values. The maximum responsivity value is about $10^5$, which is an order of magnitude greater than that of most indium arsenide photodiodes. Therefore, at optimum D*, the power gain over a photodiode is only about 100, but increases to more than 5,000 at higher bias voltages where $D^*_{BB}$ is about $2 \times 10^9$. At optimum $D^*_{BB}$, the power dissipation in the phototransistor is about 5 microwatts, and at peak responsivity, about 120 microwatts. In addition, the low impedance of the device, typically from 1,000 to 2,000 ohms, makes it ideal for incorporation in simple transistor circuitry.

Detector characteristics as a function of operating temperature were observed over a small temperature range above 200° K. The results are tabulated in the following table:

Phototransistor Characteristics at Temperatures Warmer Than 200° K

| Temp. (°K) | $D^*_{BB}(\times 10^8)$ | $I_{SIG}$(amps)($\times 10^{-7}$) | Gain |
|---|---|---|---|
| 200 | 110.0 | 8.1 | 647 |
| 213 | 15.0 | 8.09 | 648 |
| 249 | 6.7 | 2.63 | 210 |
| 267 | 2.7 | 2.37 | 190 |

The gain was nearly constant up to 213° K, or higher, while $D^*_{BB}$ decreased from $1 \times 10^{10}$ to $1.5 \times 10^9$, which is consistent with the theoretical increase in the saturation current density of an indium arsenide diffused junction. The measured response time of a phototransistor was about 20 microseconds.

Figure 11:
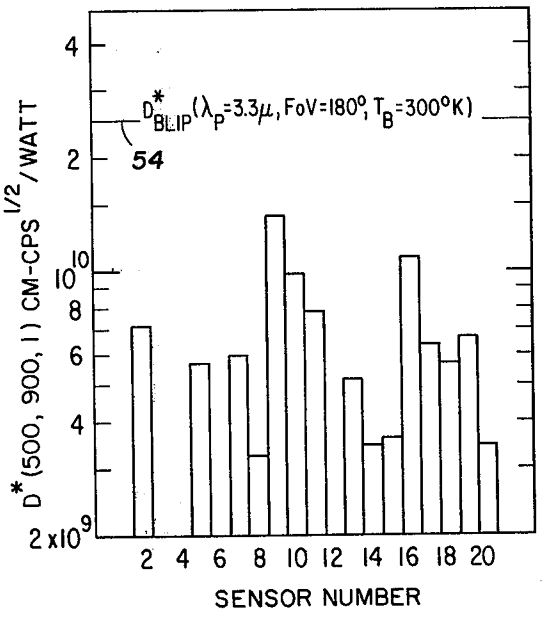
FIG. 11 is a histogram of twenty phototransistors fabricated in accordance with this invention on a common semiconductor substrate using the same process steps.

A twenty-element array of phototransistors was fabricated on 0.25 millimeter centers on a common substrate using the same process steps. FIG. 11 is a detectivity histogram of the twenty elements. Elements 1, 3, 4, 6, and 12 were faulty due to poor connections in the test equipment. It will be noted that the detectivity values vary over a relatively wide range, but that several of the elements have a detectivity approaching the maximum theoretical value represented by line 54.

The phototransistors tend to have a low gain, high noise figure, and very high impedance immediately after fabrication. However, after exposure to a vacuum at room temperature for a few hours, the phototransistors exhibit the characteristics heretofore described. The improved characteristics are maintained as long as the transistor remains in the vacuum. In some instances transistors have been exposed to room ambient for several days, and upon re-evacuation and testing have shown no deterioration in performance. In other instances, however, phototransistors have increased in impedance with little change in the D* value, although the bias current point of the optimum D* value is reduced proportionately with the increase in impedance. It has also been noted that when the impedance changes, the bias voltage point of the optimum D* remains nearly constant. After evacuation for a few hours, however, the transistor again assumes its low impedance value. Thus, it appears that it is essential to reduce the native oxides of indium arsenide in order to achieve high rectifying Schottky barrier junctions and thereby achieve high gain phototransistors. A phototransistor initially exhibiting a moderate gain has higher rectification and higher gain after exposure to heat and forming gas. However, a very low gain with very high rectification resulted when the transistor was exposed to oxygen and heated, which indicates that an insulating barrier was formed. These facts indicate that the transistor usually has a partially conducting oxide at the rectifying junction formed in the aluminum-indium arsenide interface when initially fabricated. Upon evacuation, the oxide is reduced and an efficient Schottky barrier junction is formed with the result that the current gain and D* value increase. If the initial oxidation is strong, an insulating barrier results, and reduction is then difficult. When the surface of the p-type region 18 is degenerate, or when the contact is alloyed, the contact is ohmic and no gain results.

In view of the above discussion, it will be noted that oxidation of the indium arsenide layer underlying the porous aluminum contact degrades the performance of the transistor. Thus, the long term stability of the transistor can generally be improved by first reducing the oxide under the metal contact to achieve the desired device performance, and then coating the device, and particularly the oxygen porous aluminum contact, with a layer that is not as permeable to oxide, such as by an additional layer of the metal or by applying a layer of another material such as the insulating material.

Although preferred embodiments of the invention have been described in rather specific terms, it is to be understood that various changes, substitutions and alterations can be made therein without departing from the spirit and scope of the invention as defined by the appended claims.

We claim:

1. In a process for fabricating a phototransistor, the steps comprising:

diffusing a p-type impurity into a predetermined area of a substrate of III-V compound semiconductor material of n-type to form a p-type region in said n-type substrate such that a photosensitive diode junction is provided between the p-type region and the n-type substrate, removing at least a portion of the substrate in said predetermined area comprising the p-type region to remove surface oxides therefrom and to reduce the level of p-type impurity concentration by exposing the p-type region at a depth having a sufficiently low impurity concentration for subsequent formation of a rectifying contact with a metal film to be deposited thereon, and depositing a metal film on said exposed portion of said p-type region to produce a rectifying junction therewith.

2. A process as set forth in claim 1, wherein the removal of at least a portion of the substrate in said predetermined area comprising the p-type region is accomplished by etching.

3. A process as set forth in claim 1, further including placing the substrate after deposit of said metal film on said exposed portion of said p-type region in a reducing atmosphere to reduce any oxide formed at the junction between said metal film and said p-type region.

4. The process defined in claim 1 wherein the p-type impurity is diffused from the vapor stage using a two zone process to produce an error function diffusion profile.

5. A process as set forth in claim 1, wherein the substrate of III-V compound semiconductor material of n-type is selected from the group consisting of indium arsenide, indium antimonide and gallium antimonide.

6. A process as set forth in claim 5, wherein said substrate is n-type indium arsenide.

7. A process as set forth in claim 5, wherein said p-type impurity diffused into said predetermined area of said substrate is selected from the group consisting of cadmium, zinc and magnesium.

8. A process as set forth in claim 7, wherein said p-type impurity is cadmium.

9. A process for fabricating a phototransistor comprising the steps of:

selectively diffusing a p-type impurity into a predetermined area of an n-type substrate of III-V compound semiconductor material to form a p-type region in said n-type substrate such that a photosensitive diode junction is provided between said p-type region and said n-type substrate, removing at least a portion of said substrate in said predetermined area comprising the p-type region to remove surface oxides therefrom and to reduce the level of p-type impurity concentration by exposing the p-type region at a depth having a sufficiently low impurity concentration enabling said p-type region to be capable of producing a rectifying junction with a metal film to be deposited thereon, and depositing a patterned metal film on said exposed portion of said p-type region and on the surface of said n-type substrate at a position spaced from said p-type region so as to simultaneously produce a rectifying junction between said exposed portion of the p-type region and said metal film and an ohmic contact between said substrate surface and said metal film at the position spaced from said p-type region.

10. A process as set forth in claim 9, wherein the removal of at least a portion of the substrate in said predetermined area comprising the p-type region is accomplished by etching.

11. A process for fabricating a phototransistor comprising the steps of:

providing a substrate of n-type indium arsenide material, placing said substrate and a p-type impurity consisting of cadmium into an evacuated chamber, heating said substrate to a first temperature and said cadmium to a second temperature lower than said first temperature within said evacuated chamber to diffuse said cadmium into a predetermined area of said substrate to form a p-type region therein such that a photosensitive diode junction is provided between the p-type region and said substrate having an error function diffusion profile, removing at least a portion of said substrate in said predetermined area comprising said p-type region to remove surface oxides therefrom and to reduce the level of p-type impurity concentration by exposing the p-type region at a depth having a sufficiently low impurity concentration within said error function diffusion profile to enable said p-type region to produce a rectifying junction with a metal film to be deposited thereon, and depositing a metal film on said exposed portion of the p-type region to produce a rectifying junction.

12. A process as set forth in claim 11, wherein said metal film is simultaneously deposited on said exposed portion of said p-type region and on the surface of said substrate at a position spaced from said p-type region to produce said rectifying junction between said exposed portion of said p-type region and said metal film and an ohmic contact between said substrate surface and said metal film at the position spaced from said p-type region.

13. A process as set forth in claim 11, wherein said portion of said substrate in said predetermined area comprising said p-type region is removed until the final thickness of said p-type region is approximately 10 microns.

14. A process as set forth in claim 11, wherein said substrate and said cadmium are subjected to heating at said first and second temperatures respectively until said p-type region has a surface concentration of about $8 \times 10^{16}$ atoms per cubic centimeter.

15. A process as set forth in claim 11, wherein said metal film is deposited on said exposed portion of said p-type region to a thickness of approximately 5,000 angstroms.

16. A process as set forth in claim 11, wherein said substrate is heated to a first temperature of approximately 650°C and said cadmium is heated to a second temperature of approximately 600°C.

* * * * *